(12) United States Patent
Zhong et al.

(10) Patent No.: US 11,245,056 B2
(45) Date of Patent: Feb. 8, 2022

(54) WAVELENGTH CONVERTING MATERIAL AND LIGHT EMITTING DEVICE

(71) Applicant: Lextar Electronics Corporation, Hsinchu (TW)

(72) Inventors: Chang-Zhi Zhong, Hsinchu (TW); Hung-Chia Wang, Hsinchu (TW); Hung-Chun Tong, Hsinchu (TW); Yu-Chun Lee, Hsinchu (TW); Tzong-Liang Tsai, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 275 days.

(21) Appl. No.: 16/698,978

(22) Filed: Nov. 28, 2019

(65) Prior Publication Data

US 2021/0126167 A1    Apr. 29, 2021

(30) Foreign Application Priority Data

Oct. 29, 2019  (TW) .................. 108139118

(51) Int. Cl.
*H01L 33/50* (2010.01)
*H01L 33/06* (2010.01)
(Continued)

(52) U.S. Cl.
CPC ............ *H01L 33/502* (2013.01); *C09K 11/02* (2013.01); *C09K 11/025* (2013.01); *C09K 11/64* (2013.01);
(Continued)

(58) Field of Classification Search
CPC ...... H01L 33/502; C09K 11/02; C09K 11/025
See application file for complete search history.

(56) References Cited

U.S. PATENT DOCUMENTS

| 10,852,587 B2 * | 12/2020 | Nam ................. G02F 1/133602 |
| 2016/0250612 A1 * | 9/2016 | Oldenburg ............... B01J 13/20 428/404 |
| 2019/0273189 A1 | 9/2019 | Lotito et al. |

FOREIGN PATENT DOCUMENTS

| CN | 101117578 A | 2/2008 |
| CN | 101336479 A | 12/2008 |

(Continued)

OTHER PUBLICATIONS

Jacek Klinowski et al., A Re-examination of Si, Al Ordering in Zeolites NaX and NaY, J. Chem. Soc, Faraday Trans.2, Jan. 1982, 78, 1025-1050.

*Primary Examiner* — Scott B Geyer (74) *Attorney, Agent, or Firm* — CKC & Partners Co., LLC (57) ABSTRACT

A wavelength converting material includes a luminous core and a first protective layer. The first protective layer covers the luminous core, and the first protective layer includes aluminum silicate. The aluminum silicate includes a plurality of silicon atoms, each of the silicon atoms is one of a zeroth configuration $Q^4(0Al)$, first configuration $Q^4(1Al)$, second configuration $Q^4(2Al)$, third configuration $Q^4(3Al)$, and fourth configuration $Q^4(4Al)$. The silicon atoms of the zeroth configuration do not connect with aluminum oxide group, and the silicon atoms of the first, second, third, and fourth configurations respectively connect with one, two, three, and four aluminum oxide group(s). A total number of the silicon atoms of the third configuration and the fourth configuration is larger than a total number of the silicon atoms of the zeroth configuration, the first configuration, and the second configuration.

15 Claims, 8 Drawing Sheets

(51) Int. Cl.
  *H01L 31/0216* (2014.01)
  *C09K 11/02* (2006.01)
  *C09K 11/77* (2006.01)
  *C09K 11/64* (2006.01)
  *B82Y 20/00* (2011.01)

(52) U.S. Cl.
  CPC ...... *C09K 11/7774* (2013.01); *H01L 31/0216* (2013.01); *H01L 33/06* (2013.01); *H01L 33/504* (2013.01); *B82Y 20/00* (2013.01); *H01L 2933/0041* (2013.01)

(56) References Cited

FOREIGN PATENT DOCUMENTS

| | | | | |
|---|---|---|---|---|
| CN | 102270728 | A | 12/2011 | |
| CN | 103619991 | A | 3/2014 | |
| CN | 107075356 | A | 8/2017 | |
| CN | 107541203 | A | 1/2018 | |
| CN | 108884564 | A | 11/2018 | |
| CN | 109313954 | A | 2/2019 | |
| CN | 110270335 | A * | 9/2019 | ............... C07C 2/10 |
| GN | 102531580 | B | 1/2014 | |
| TW | 201819488 | A | 6/2018 | |
| TW | 201835297 | A | 10/2018 | |
| TW | 201930502 | A | 8/2019 | |
| TW | I667332 | B | 8/2019 | |
| WO | 2014093391 | A2 | 6/2014 | |
| WO | WO-2015054493 | A1 * | 4/2015 | ......... C09B 67/0007 |
| WO | 2018/000704 | A1 | 1/2018 | |
| WO | 2019186735 | A1 | 10/2019 | |
| WO | WO-2021030368 | A1 * | 2/2021 | ........... C04B 14/041 |

* cited by examiner

WAVELENGTH CONVERTING MATERIAL AND LIGHT EMITTING DEVICE

RELATED APPLICATIONS

This application claims priority to Taiwan Application Serial Number 108139118, filed Oct. 29, 2019, which is herein incorporated by reference.

BACKGROUND

Field of Invention

The present disclosure relates to a wavelength converting material and a light emitting device.

Description of Related Art

Quantum dots and phosphors are common wavelength converting materials that can be applied to light-emitting diodes to absorb light from a light-emitting diode chip and emit light of other colors which can further be blended into desired color light. Furthermore, the quantum dots or the phosphors can be combined with a light-emitting diode device as a backlight or a pixel of a display.

However, the wavelength converting materials are susceptible to destruction by oxygen and moisture, which in turn causes a decrease in luminescence brightness and lifetime. Therefore, there is a need for a technical solution to reduce damage to the wavelength converting materials by oxygen and moisture, and hence reliability of the wavelength converting materials can be improved.

SUMMARY

The disclosure relates in general to a wavelength converting material and a light emitting device.

According to an embodiment of the present disclosure, the wavelength converting material includes a luminous core and a first protective layer. The first protective layer covering the luminous core, in which the first protective layer includes aluminum silicate, the aluminum silicate includes a plurality of silicon atoms, each of the silicon atoms is one of a zeroth configuration $Q^4(0Al)$, a first configuration $Q^4(1Al)$, a second configuration $Q^4(2Al)$, a third configuration $Q^4(3Al)$ and a fourth configuration $Q^4(4Al)$, the silicon atoms of the zeroth configuration $Q^4(0Al)$ do not connect with aluminum oxide group, the silicon atoms of the first configuration $Q^4(1Al)$ connect with one aluminum oxide group, the silicon atoms of the second configuration $Q^4(2Al)$ connect with two aluminum oxide groups, the silicon atoms of the third configuration $Q^4(3Al)$ connect with three aluminum oxide groups, the silicon atoms of the fourth configuration $Q^4(4Al)$ connect with four aluminum oxide groups, and a total number of the silicon atoms of the third configuration $Q^4(3Al)$ and the fourth configuration $Q^4(4Al)$ is larger than a total number of the silicon atoms of the zeroth configuration $Q^4(0Al)$, the first configuration $Q^4(1Al)$, and the second configuration $Q^4(2Al)$.

In an embodiment of the present disclosure, as a total number of the silicon atoms of the aluminum silicate is 100%, a total number of the silicon atoms of the third configuration $Q^4(3Al)$ and the fourth configuration $Q^4(4Al)$ is larger than 80%.

In an embodiment of the present disclosure, in a $^{29}Si$ nuclear magnetic resonance ($^{29}Si$ NMR) spectroscopy of the wavelength converting material, a chemical shift of a waveform peak of each of the silicon atoms of the aluminum silicate is in a range from about −70 ppm to about −120 ppm, and in a $^{27}Al$ nuclear magnetic resonance ($^{27}Al$ NMR) spectroscopy of the wavelength converting material, a chemical shift of a waveform peak of each of the aluminum atoms of the aluminum silicate is in a range from about 40 ppm to about 80 ppm.

In an embodiment of the present disclosure, in a $^{29}Si$ nuclear magnetic resonance ($^{29}Si$ NMR) spectroscopy of the wavelength converting material, a chemical shift of a waveform peak of the third configuration $Q^4(3Al)$ is in a range from about −84 ppm to about −95 ppm, and a chemical shift of a waveform peak of the fourth configuration $Q^4(4Al)$ is in a range from about −80 ppm to about −93 ppm.

In an embodiment of the present disclosure, the aluminum silicate includes a plurality of aluminum atoms, each of the aluminum atoms is one of a third configuration $q^3(3Si)$ and a fourth configuration $q^4(4Si)$, the aluminum atoms of the third configuration $q^3(3Si)$ connect with three silicon oxide groups, the silicon atoms of the fourth configuration $q^4(4Si)$ connect with four silicon oxide groups, and in a $^{27}Al$ nuclear magnetic resonance ($^{27}Al$ NMR) spectroscopy of the wavelength converting material, chemical shifts of waveform peaks of the third configuration $q^3(3Si)$ and the fourth configuration $q^4(4Si)$ are in a range from about 50 ppm to about 80 ppm.

In an embodiment of the present disclosure, the luminous core includes a quantum dot material.

In an embodiment of the present disclosure, a surface of the quantum dot material is subjected to a modification treatment including a ligand exchange treatment, a microemulsion treatment, an organic material coating, an inorganic material coating, an embedding into pores of mesoporous particles or combinations thereof.

In an embodiment of the present disclosure, the luminous core includes a phosphor powder material.

In an embodiment of the present disclosure, a surface of the phosphor powder material is subjected to a modification treatment comprising an organic material coating, an inorganic material coating or combinations thereof.

In an embodiment of the present disclosure, a material used in the organic material coating includes poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy, silicone or combinations thereof.

In an embodiment of the present disclosure, a material used in the inorganic material coating includes nitride, metal oxide, silicon oxide or combinations thereof.

According to an embodiment of the present disclosure, the light emitting device includes a solid-state semiconductor light-emitting element and a wavelength converting material. The solid-state semiconductor light-emitting element is configured to emit first light. The wavelength converting material of claim 1 absorbs portions of the first light, and emits second light of a wavelength different from a wavelength of the first light.

In an embodiment of the present disclosure, the solid-state semiconductor light-emitting element is a light-emitting diode.

In the aforementioned embodiments of the present disclosure, since the first protective layer protects the luminous core from damage by external substances such as oxygen and moisture, the wavelength converting material can have a good luminescence lifetime. In particular, the aluminum silicate of the first protective layer has a composition of specific configurations, such that the first protective layer can perform a better protective function than a general protective layer. Furthermore, the light emitting device including the aforementioned wavelength converting material can have good reliability.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
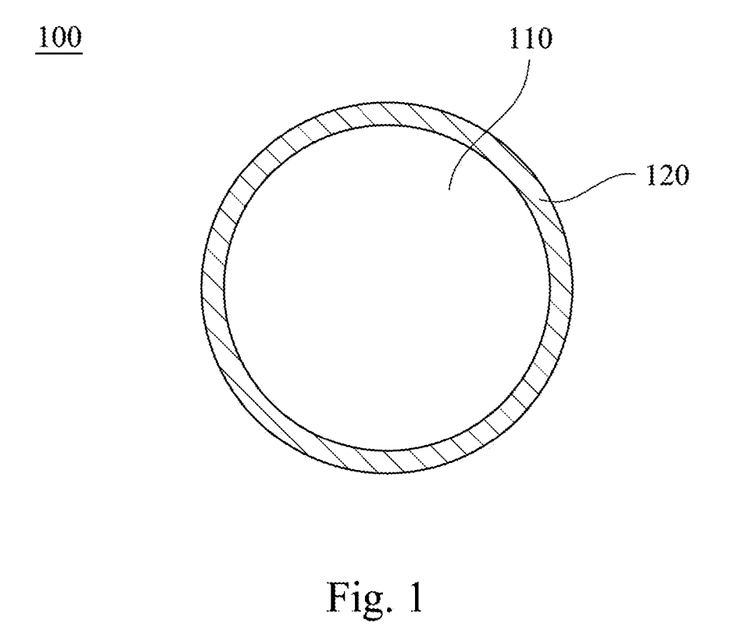
FIG. 1 is a cross-sectional view of a wavelength converting material according to an embodiment of the present disclosure.

FIG. 1 is a cross-sectional view of a wavelength converting material 100 according to an embodiment of the present disclosure. The wavelength converting material 100 includes a luminous core 110 and a first protective layer 120, and the first protective layer 120 covers the luminous core 110. The luminous core 110 may include a quantum dot material or a phosphor powder material.

In some embodiments, the first protective layer 120 includes aluminum silicate. Specifically, the aluminum silicate of the first protective layer 120 includes a plurality of silicon atoms, and each of the silicon atoms is one of a zeroth configuration $Q^4(0Al)$, a first configuration $Q^4(1Al)$, a second configuration $Q^4(2Al)$, a third configuration $Q^4(3Al)$ and a fourth configuration $Q^4(4Al)$. In detail, the silicon atoms of the zeroth configuration $Q^4(0Al)$ do not connect with aluminum oxide group, the silicon atoms of the first configuration $Q^4(1Al)$ connect with one aluminum oxide group, the silicon atoms of the second configuration $Q^4(2Al)$ connect with two aluminum oxide groups, the silicon atoms of the third configuration $Q^4(3Al)$ connect with three aluminum oxide groups, and the silicon atoms of the fourth configuration $Q^4(4Al)$ connect with four aluminum oxide groups. Stated differently, in the term $Q^n(mAl)$, "n" represents a number of chemical bonds between the silicon atoms, and "m" represents a number of the silicon atoms sequentially bonding to oxygen atoms and aluminum atoms, in which "n" may be 4, and "m" may be chosen from a number form 0, 1, 2, 3, and 4.

In some embodiments, the silicon atoms of the zeroth configuration $Q^4(0Al)$ may be a structure shown in the chemical structure formula (1) as below, in which R is a linear alkyl group, a branched alkyl group, or a hydrogen atom.

formula (1)

In some embodiments, the silicon atoms of the first configuration $Q^4(1Al)$ may be a structure shown in the chemical structure formula (2) as below, in which R is a linear alkyl group, a branched alkyl group, or a hydrogen atom.

formula (2)

In some embodiments, the silicon atoms of the second configuration $Q^4(2Al)$, the third configuration $Q^4(3Al)$, and the fourth configuration $Q^4(4Al)$ may be a structure shown in the chemical structure formula (3) as below. In the chemical structure formula (3), the silicon atom denoted by a $^4(1Al)$ is the first configuration $Q^4(1Al)$, the silicon atom denoted by $Q^4(2Al)$ is the second configuration $Q^4(2Al)$, the silicon atom denoted by $Q^4(3Al)$ is the third configuration $Q^4(3Al)$, and the silicon atom denoted by $Q^4(4Al)$ is the fourth configuration $Q^4(4Al)$, in which R is a linear alkyl group, a branched alkyl group, or a hydrogen atom.

formula (3)

In the aluminum silicate of the first protective layer 120, a total number of the silicon atoms of the third configuration $Q^4(3Al)$ and the fourth configuration $Q^4(4Al)$ is larger than a total number of the silicon atoms of the zeroth configuration $Q^4(0Al)$, the first configuration $Q^4(1Al)$, and the second configuration $Q^4(2Al)$. It is noted that the "number" mentioned herein refers to a "mole number". Specifically, under normal conditions, water and oxygen resistance of aluminum oxide ($Al_2O_3$) is better than that of the silicon oxide ($SiO_2$), and the first protective layer 120 including a majority of the silicon atoms of the third configuration $Q^4(3Al)$ and the fourth configuration $Q^4(4Al)$ can increase the proportion of the aluminum oxide ($Al_2O_3$) in the first protective layer 120, making the first protective layer 120 perform a better protective function (i.e., have a better resistance to water and oxygen), thereby greatly enhancing the tolerance of the luminous core 110 in the first protective layer 120.

In some embodiments, as a total number of the silicon atoms of the aluminum silicate is 100%, a total number of the silicon atoms of the third configuration $Q^4(3Al)$ and the fourth configuration $Q^4(4Al)$ is larger than 80%. For example, the total number of the silicon atoms of the third configuration $Q^4(3Al)$ and the fourth configuration $Q4(4Al)$ may be 85%, 90%, 95% or 99%. In another embodiment, a number of the silicon atoms of the fourth configuration $Q^4(4Al)$ is larger than a number of the silicon atoms of the third configuration $Q^4(3Al)$. In other embodiments, the number of the silicon atoms of the fourth configuration $Q^4(4Al)$ is larger than a total number of the silicon atoms of the zeroth configuration $Q^4(0Al)$, the first configuration $Q^4(1Al)$, the second configuration $Q^4(2Al)$, and the third configuration $Q^4(3Al)$.

On the other hand, in a plurality of the aluminum atoms of the aluminum silicate, each of the aluminum atoms is one of a third configuration $q^3(3Si)$ and a fourth configuration $q^4(4Si)$. In detail, the aluminum atoms of the third configuration $q^3(3Si)$ connect with three silicon oxide groups, the silicon atoms of the fourth configuration $q^4(4Si)$ connect with four silicon oxide groups. In other words, in the term $q^n(mSi)$, "n" represents a number of chemical bonds between the aluminum atoms, and "m" represents a number of the aluminum atoms sequentially bonding to oxygen atoms and silicon atoms, in which "n" may be chosen from a number form 3 and 4, and "m" may be chosen from a number form 3 and 4.

In some embodiments, the aluminum atoms of the third configuration $q^3(3Si)$ may be a structure shown in the chemical structure formula (4) as below, in which R is a linear alkyl group, a branched alkyl group, or a hydrogen atom.

formula (4)

In some embodiments, the aluminum atoms of the fourth configuration $Q^4(4Al)$ may be a structure shown in the chemical structure formula (5) as below. In the chemical structure formula (5), the aluminum atom denoted by $q^3(3Si)$ is the third configuration $q^3(3Si)$, and the aluminum atom denoted by $q^4(4Si)$ is the fourth configuration $q^4(4Si)$ are marked as $q^4(4Si)$, in which R is a linear alkyl group, a branched alkyl group, or a hydrogen atom.

formula (5)

In some embodiments, a number of the aluminum atoms of the fourth configuration $q^3(4Si)$ is larger than a number of the aluminum atoms of the third configuration $q^3(3Si)$. In another embodiment, as a total number of the aluminum atoms of the aluminum silicate is 100%, a total number of the silicon atoms of the third configuration $q^3(3Si)$ and the fourth configuration $q^3(4Si)$ is larger than 80%. For example, the total number of the silicon atoms of the third configuration $q^3(3Si)$ and the fourth configuration $q^3(4Si)$ may be 85%, 90%, 95% or 99%.

Since the first protective layer 120 protects the luminous core from damage by external substances such as oxygen and moisture, the wavelength converting material 100 can have a good luminescence lifetime. In particular, the aluminum silicate of the first protective layer 120 has a composition of specific configurations, such that the first protective layer 120 can perform a better protective function than a general protective layer.

In some embodiments, the luminous core 110 includes the quantum dot material. For example, the quantum dot material includes CdSe, CdTe, ZnS, ZnSe, ZnTe, ZnO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, HgZnSTe, GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, $CsPbX_3$ or $Cs_4PbX_6$, in which X is chloride, bromide, iodide or combinations thereof.

In some embodiments, other than being coated by the first protective layer 120, a surface of the quantum dot material can further be subjected to a modification treatment, such as a ligand exchange treatment, a microemulsion treatment, an organic material coating, an inorganic material coating, an embedding into pores of mesoporous particles or combinations thereof. The quantum dot material being subjected to the modification treatment can have a better luminescence lifetime.

For example, a material used in the organic material coating includes poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy, silicone or combinations thereof. Furthermore, a material used in the inorganic material coating includes nitride, metal oxide, silicon oxide or combinations thereof.

In some embodiments, the luminous core 110 includes the phosphor powder material. For example, the phosphor powder material includes $Y_3Al_5O_{12}$(YAG), LuYAG, GaYAG, $SrS:Eu^{2+}$, $SrGa_2S_4:Eu^{2+}$, $ZnS:Cu^+$, $ZnS:Ag^+$, $Y_2O_2S:Eu^{2+}$, $La_2O_2S:Eu^{2+}$, $Gd_2O_2S:Eu^{2+}$, $SrGa_2S_4:Ce^{3+}$, $ZnS:Mn^{2+}$, $SrS:Eu^{2+}$, $CaS:Eu^{2+}$, $(Sr_{1-x}Ca_x)S:Eu^{2+}$, $Ba_2SiO_4:Eu^{2+}$, $Sr_2SiO_4:Eu^{2+}$, $Ca_8Mg(SiO_4)_4Cl_2:Eu^{2+}$, $(Mg,Ca,Sr,Ba)_3Si_2O_7:Eu^{2+}$, $(Mg,Ca,Sr,Ba)_2SiO_4:Eu^{2+}$, $(Sr,Ca,Ba)Si_xO_yN_z:Eu^{2+}$, $Ca_2Si_5N_8:Eu^{2+}$, $(Ca,Mg,Y)Si_wAl_xO_yN_z:Ce^{2+}$, $(Ca,Mg,Y)Si_wAl_xO_yN_z:Eu^{2+}$, $K_2GeF_6:Mn^{4+}$, $K_2SiF_6:Mn^{4+}$, $K_2TiF_6:Mn^{4+}$, $Sr(LiAl_3N_4):Eu^{2+}$, $Si_{6-n}Al_nO_nN_{8-n}(n=0-4.2):Eu^{2+}$ or combinations thereof.

In some embodiments, other than being coated by the first protective layer 120, a surface of the phosphor powder material can further be subjected to a modification treatment, such as an organic material coating, an inorganic material coating or combinations thereof. The quantum dot material being subjected to the modification treatment can have a better luminescence lifetime.

For example, a material used in the organic material coating includes poly(methyl methacrylate), polyethylene terephthalate, polyethylene naphthalate, polystyrene, polyvinylidene difluoride, polyvinyl acetate, polypropylene, polyamide, polycarbonate, polyimide, epoxy, silicone or combinations thereof. Furthermore, a material used in the inorganic material coating includes nitride, metal oxide, silicon oxide or combinations thereof.

Figure 2:
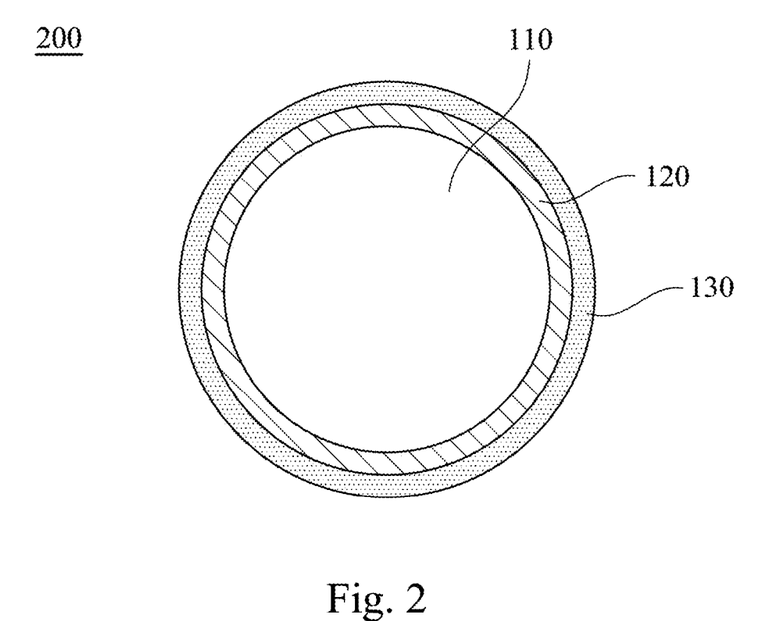
FIG. 2 is a cross-sectional view of a wavelength converting material according to another embodiment of the present disclosure.

FIG. 2 is a cross-sectional view of a wavelength converting material 200 according to another embodiment of the present disclosure. A difference between the wavelength converting material 200 and the wavelength converting material 100 is that the wavelength converting material 200 further includes a second protective layer 130. The second protective layer 130 covers the first protective layer 120. In some embodiments, the second protective layer 130 can include organic materials such as poly(methyl methacrylate), polyethylene terephthalate, polyethylene naphthalate, polystyrene, polypropylene, polyamide, polycarbonate, polyimide, epoxy, silicone. In another embodiments, the second protective layer 130 can include inorganic materials such as titanium dioxide ($TiO_2$), silicon oxide ($SiO_2$), boron nitride (BN) or zinc oxide (ZnO).

Since the second protective layer 130 can also protect the luminous core 110 from damage by external substances such as oxygen and moisture, the wavelength converting material 200 can have a good luminescence lifetime. In some embodiments, the configuration of the first protective layer 120 and the second protective layer 130 can be exchanged, that is, the second protective layer 130 covers the luminous core 110, and the first protective layer 120 covers the second protective layer 130.

Figure 3A:
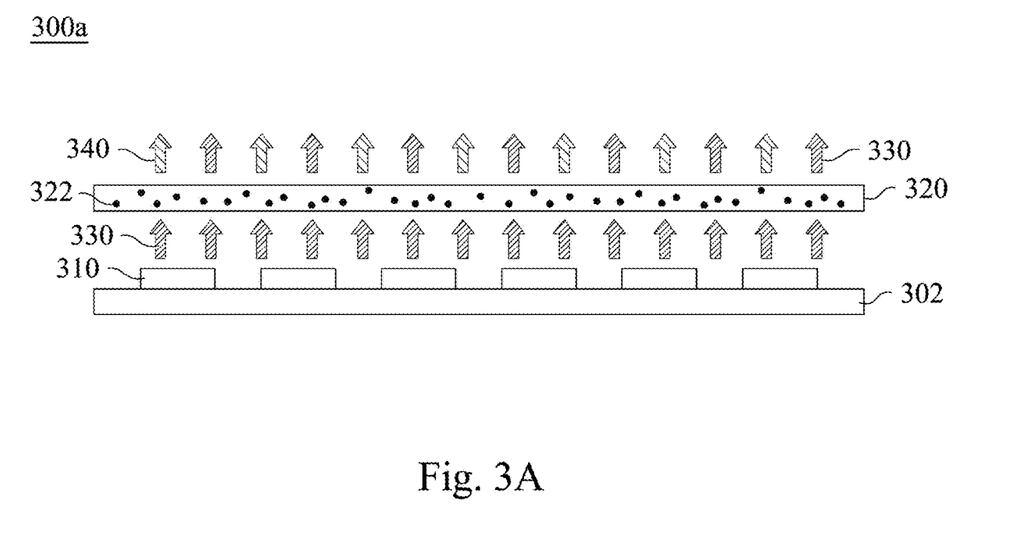
FIG. 3A is a side view of a light emitting device according to an embodiment of the present disclosure.

FIG. 3A is a side view of a light emitting device 300a according to an embodiment of the present disclosure. The light emitting device 300a includes a circuit board 302, a solid-state semiconductor light-emitting element 310, and a wavelength conversion film 320. The solid-state semiconductor light-emitting element 310 is on the circuit board 302, and the wavelength conversion film 320 includes a wavelength converting material 322. In some embodiments, the solid-state semiconductor light-emitting element 310 may be a light-emitting diode, such as a light-emitting diode chip or a package structure including a light-emitting diode chip. Furthermore, the wavelength converting material 322 may be the wavelength converting material 100 of FIG. 1 or the wavelength converting material 200 of FIG. 2, that is, the wavelength converting material 322 may include quantum dots or phosphor powder. The solid-state semiconductor light-emitting element 310 is configured to emit first light 330, and the wavelength converting material 322 absorbs portions of the first light 330 and emits second light 340 of a wavelength different from a wavelength of the first light. For example, when the solid-state semiconductor light-emitting element 310 is a blue light-emitting diode chip or a package structure including a blue light-emitting diode chip, and the wavelength converting material 322 includes red and green quantum dots (or red and green phosphor powder), the red and green quantum dots (or red and green phosphor powder) can convert portions of the blue light emitted by the solid-state semiconductor light-emitting element 310 into red light and green light. Subsequently, the red light, the green light, and the blue light which is not being converted by the red and green quantum dots are mixed into white light, and are emitted by the light emitting device 300a. For example, when the solid-state semiconductor light-emitting element 310 is a blue light-emitting diode chip or a package structure including a blue light-emitting diode chip, and the wavelength converting material 322 is YAG ($Y_3Al_5O_{12}$:Ce) yellow phosphor powder, the YAG yellow phosphor powder can convert portions of the blue light emitted by the solid-state semiconductor light-emitting element 310 into yellow light. Subsequently, the yellow light and the blue light which is not being converted by the YAG yellow phosphor are mixed into white light and are emitted by the light emitting device 300a.

Figure 3B:
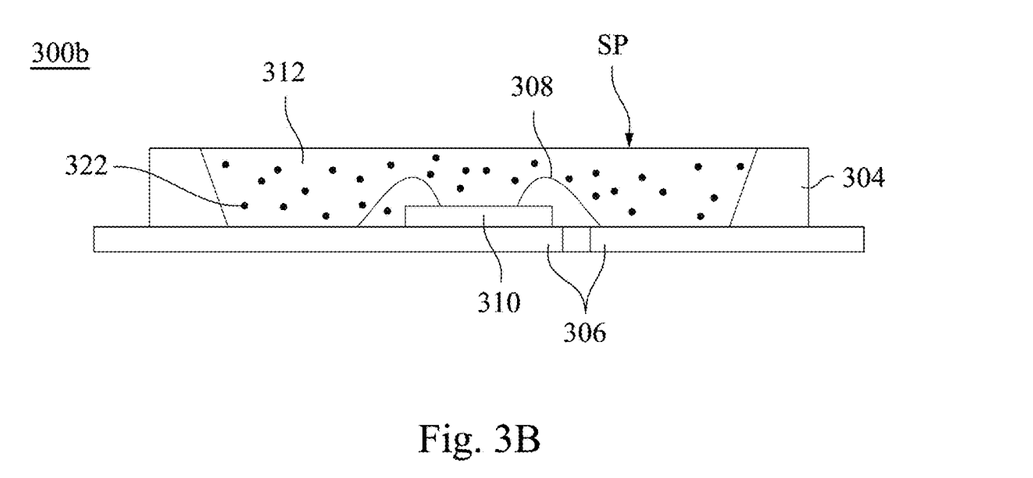
FIG. 3B is a side view of a light emitting device according to another embodiment of the present disclosure.

FIG. 3B is a side view of a light emitting device 300b according to another embodiment of the present disclosure. The light emitting device 300b includes a reflective cup wall 304, a pair of conductive stands 306 (e.g., a positive and a negative conductive stands 306), a solid-state semiconductor light-emitting element 310, a light transmissive adhesive material 312, and a wavelength converting material 322. The solid-state semiconductor light-emitting element 310 may be a light emitting-diode chip which is on the conductive stands 306 and electrically connected to the positive and negative conductive stands 306 through conductive wires 308. The reflective cup wall 304 surrounds the light emitting-diode chip and forms an accommodating space SP, and the wavelength converting material 322 is mixed with the light transmissive adhesive material 312 and filled in the accommodating space SP of the reflective cup wall 304. The wavelength converting material 322 may be the wavelength converting material 100 of FIG. 1 or the wavelength converting material 200 of FIG. 2, that is, the wavelength converting material 322 may include quantum dots or phosphor powder (e.g., red and green quantum dots, red and green phosphor powder or YAG fluorescent powder). The interactions between the light emitted by the solid-state semiconductor light-emitting element 310 and the quantum dots or the phosphor powder are as described above, and will not be repeated hereinafter.

The present disclosure provides an embodiment 1 and a comparative example 1. The wavelength converting material of the embodiment 1 is a quantum dot material CdSe coated with the first protective layer 120, and the structure of the wavelength converting material of the embodiment 1 is as shown in FIG. 1. The wavelength converting material of the comparative example 1 is a quantum dot material CdSe without being coated with any protective layer.

Figure 4:
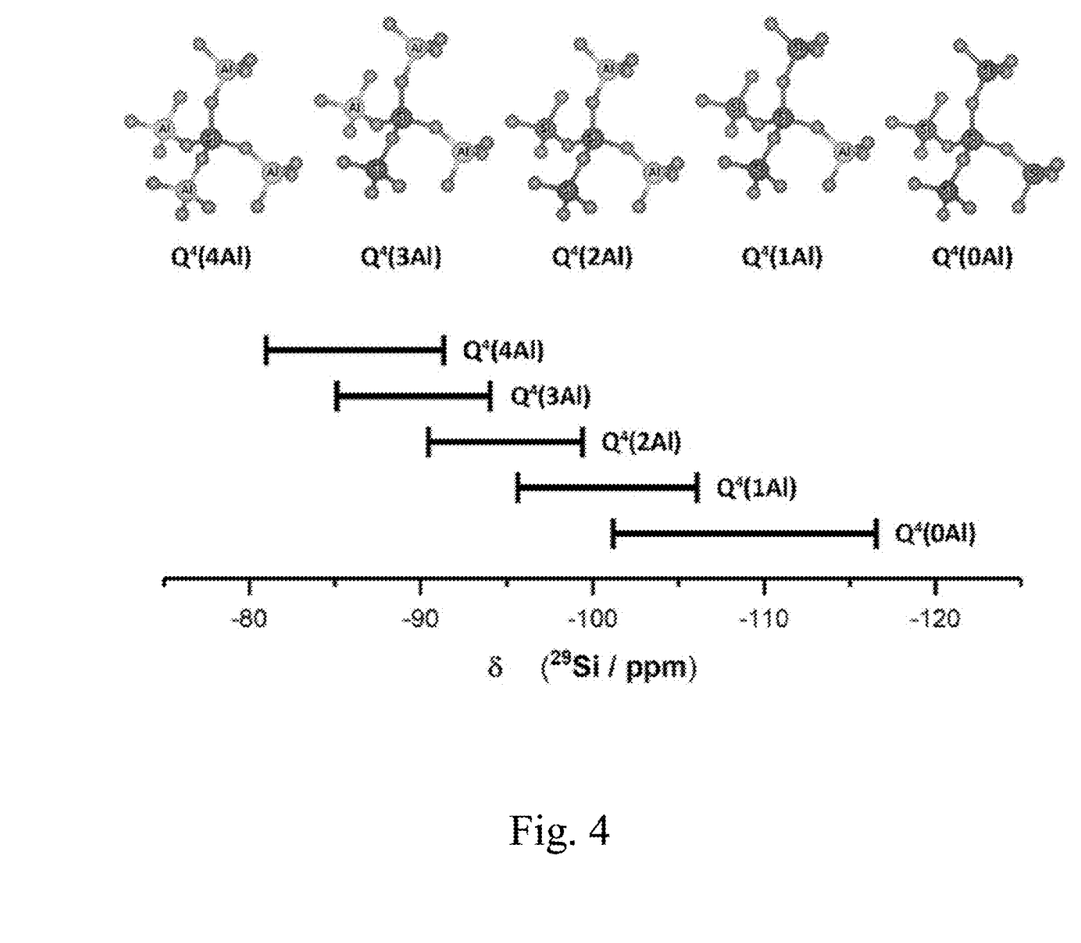
FIG. 4 is a reference of chemical shifts of different configurations of silicon in a $^{29}Si$ nuclear magnetic resonance ($^{29}Si$ NMR) spectroscopy.
Figure 5:
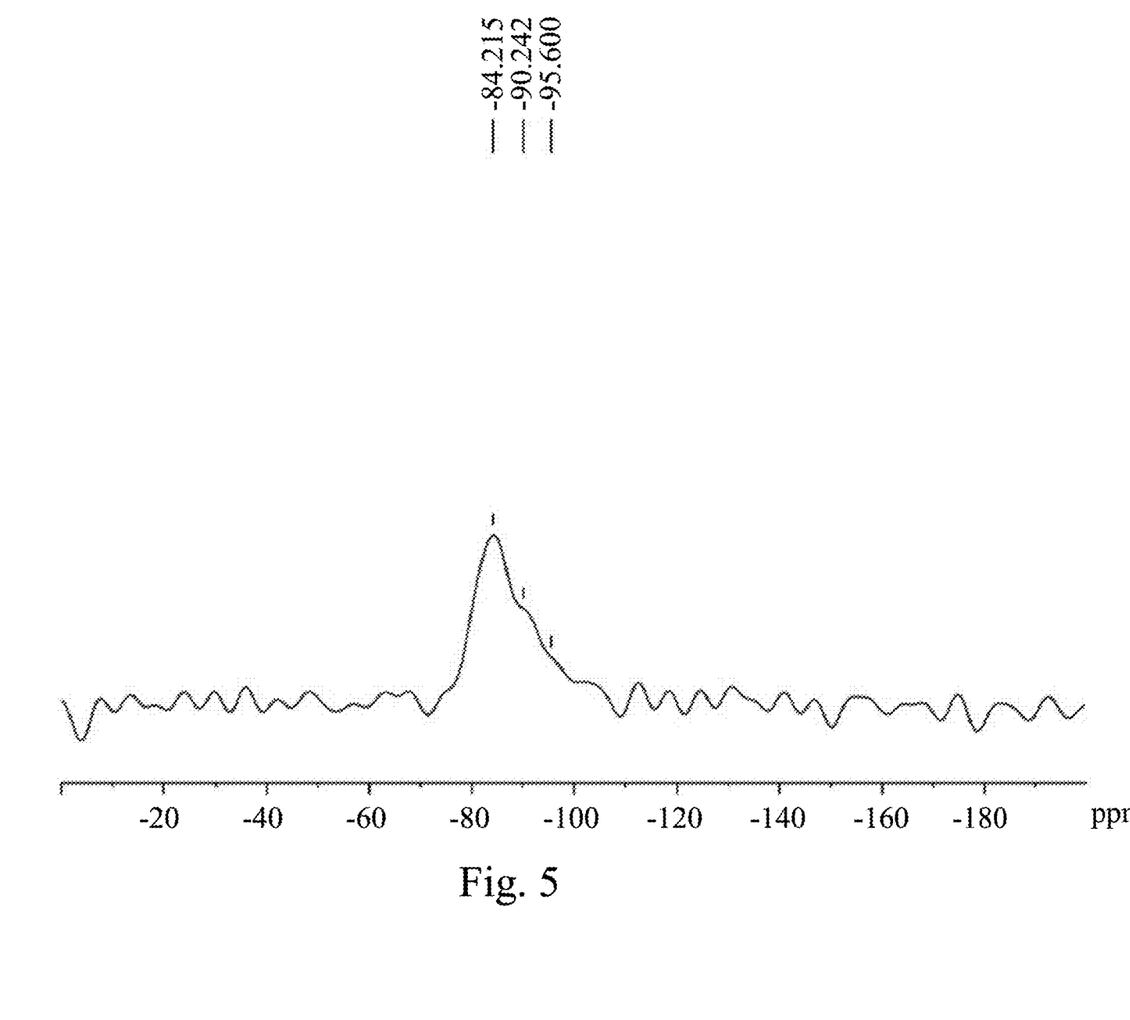
FIG. 5 is a $^{29}Si$ nuclear magnetic resonance spectroscopy of a wavelength converting material of an embodiment 1 of the present disclosure.

FIG. 4 is a reference of chemical shifts of different configurations of silicon in a $^{29}$Si nuclear magnetic resonance ($^{29}$Si NMR) spectroscopy. FIG. 5 is a $^{29}$Si nuclear magnetic resonance spectroscopy of the wavelength converting material of the embodiment 1 of the present disclosure. By comparing FIG. 4 with FIG. 5, the composition of the first protective layer 120 of the embodiment 1 can be further understood, as will be discussed in detail in the following descriptions.

Reference is first made to FIG. 4. In the $^{29}$Si nuclear magnetic resonance spectroscopy, a chemical shift of a waveform peak of the silicon atoms of the zeroth configuration $Q^4(0Al)$ is in a range from about −100 ppm to about −118 ppm, a chemical shift of a waveform peak of the silicon atoms of the first configuration $Q^4(1Al)$ is in a range from about −94 ppm to about −106 ppm, a chemical shift of a waveform peak of the silicon atoms of the second configuration $Q^4(2Al)$ is in a range from about −90 ppm to about −100 ppm, a chemical shift of a waveform peak of the silicon atoms of the third configuration $Q^4(3Al)$ is in a range from about −84 ppm to about −95 ppm, and a chemical shift of a waveform peak of the silicon atoms of the fourth configuration $Q^4(4Al)$ is in a range from about −80 ppm to about −93 ppm. In the aforementioned ranges, a margin of error for the chemical shift is ±3.0 ppm. For example, the chemical shift of the waveform peak of the silicon atoms of the zeroth configuration $Q^4(0Al)$ may be in a range from about −97 ppm to about −121 ppm.

Reference is then made to FIG. 5. In the $^{29}$Si nuclear magnetic resonance spectroscopy, a chemical shift of a waveform peak of each of the silicon atoms of the aluminum silicate is in a range from about −70 ppm to about −120 ppm, and a chemical shift of the most obvious waveform peak is in a range from about −80 ppm to about −95 ppm. This shows that the first protective layer 120 of the embodiment 1 mainly includes the silicon atoms of the third configuration $Q^4(3Al)$ and the fourth configuration $Q^4(4Al)$. Additionally, in the $^{29}Si$ nuclear magnetic resonance spectroscopy, a waveform peak of the third configuration $Q^4(3Al)$ is in a range from about −84 ppm to about −95 ppm, and a waveform peak of the fourth configuration $Q^4(4Al)$ is in a range from about −80 ppm to about −93 ppm. Furthermore, after integrating the area corresponding to the range of the chemical shift of each of the configurations, it is known that the total number of the silicon atoms of the third configuration $Q^4(3Al)$ and the fourth configuration $Q^4(4Al)$ is larger than the total number of the silicon atoms of the zeroth configuration $Q^4(0Al)$, the first configuration $Q^4(1Al)$, and the second configuration $Q^4(2Al)$.

Figure 6:
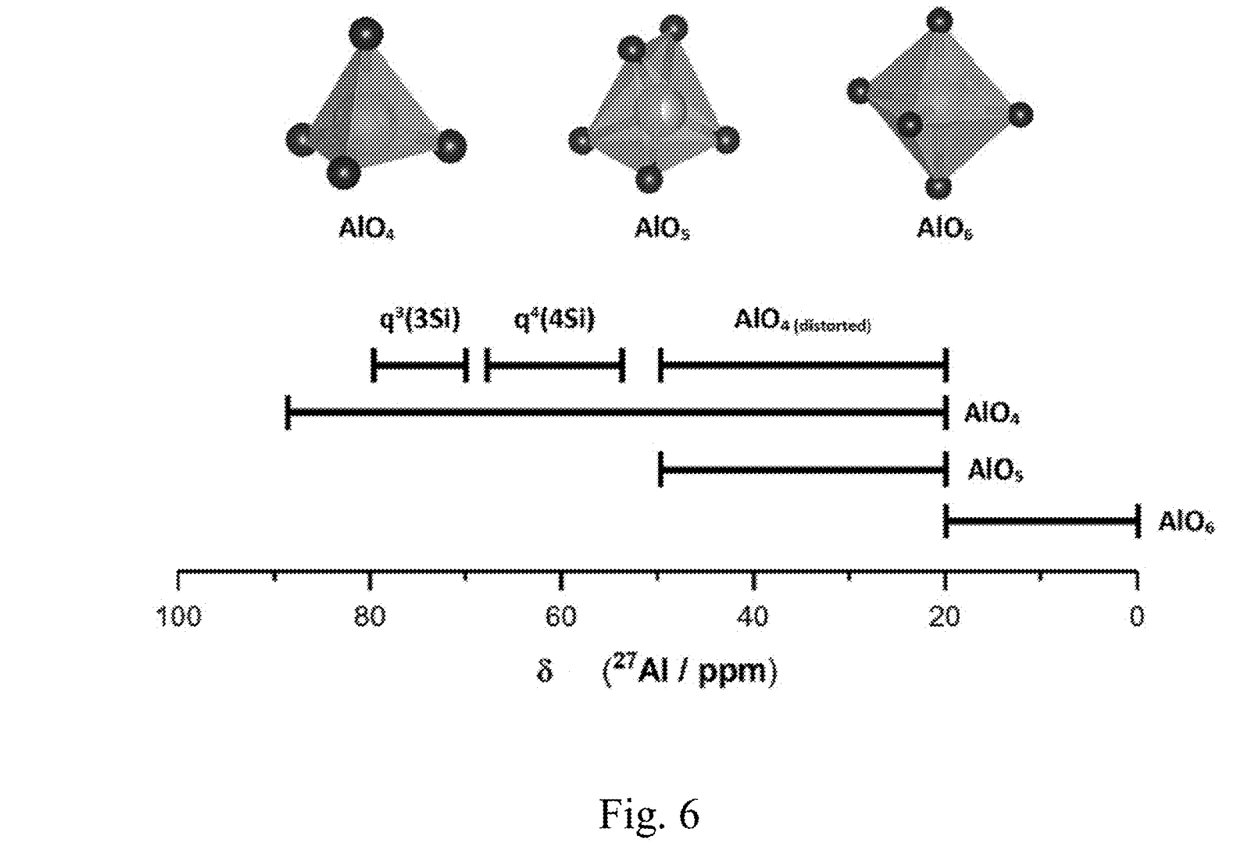
FIG. 6 is a reference of chemical shifts of different configurations of aluminum in $^{27}Al$ nuclear magnetic resonance ($^{27}Al$ NMR) spectroscopy.
Figure 7:
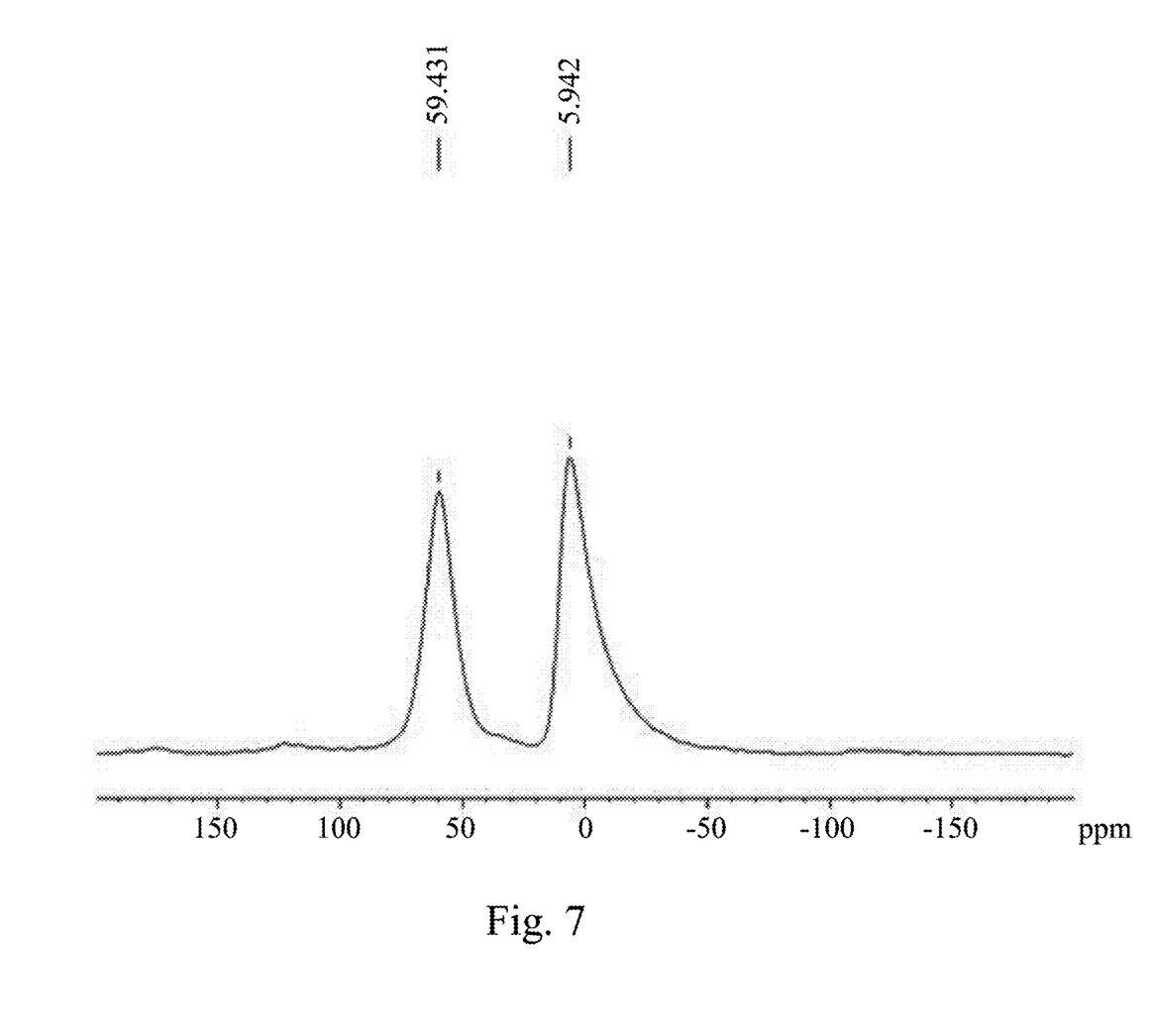
FIG. 7 is a $^{27}Al$ nuclear magnetic resonance spectroscopy of the wavelength converting material of the embodiment 1 of the present disclosure.

FIG. 6 is a reference of chemical shifts of different configurations of aluminum in $^{27}Al$ nuclear magnetic resonance ($^{27}Al$ NMR) spectroscopy. FIG. 7 is a $^{27}Al$ nuclear magnetic resonance spectroscopy of the wavelength converting material of the embodiment 1 of the present disclosure. By comparing FIG. 6 with FIG. 7, the composition of the first protective layer 120 of the embodiment 1 can be further understood, as will be discussed in detail in the following descriptions.

Reference is first made to FIG. 6. In the $^{27}Al$ nuclear magnetic resonance spectroscopy, a chemical shift of a waveform peak of the aluminum atoms of the third configuration $q^4(3Si)$ is in a range from about 72 ppm to about 82 ppm, and a chemical shift of a waveform peak of the aluminum atoms of the fourth configuration $q^4(4Si)$ is in a range from about 50 ppm to about 70 ppm. In the aforementioned ranges, a margin of error for the chemical shift is ±3.0 ppm. For example, the chemical shift of the waveform peak of the aluminum atoms of the third configuration $q^4(3Si)$ may be in a range from about 69 ppm to 85 ppm.

Reference is then made to FIG. 7. In the $^{27}Al$ nuclear magnetic resonance spectroscopy, a chemical shift of a waveform peak of each of the aluminum atoms of the aluminum silicate is in a range from about 40 ppm to about 80 ppm. Additionally, in the $^{27}Al$ nuclear magnetic resonance spectroscopy, chemical shifts of the waveform peaks of the third configuration $q^4(3Si)$ and the fourth configuration $q^4(4Si)$ are in a range from about 50 ppm to 80 ppm. It is noted that in the $^{27}Al$ nuclear magnetic resonance spectroscopy of the first protective layer 120 of the present disclosure, peaks appear in a chemical shift range from about 5 ppm to about 6 ppm are signals caused by $H_2O$ molecules.

Figure 8:
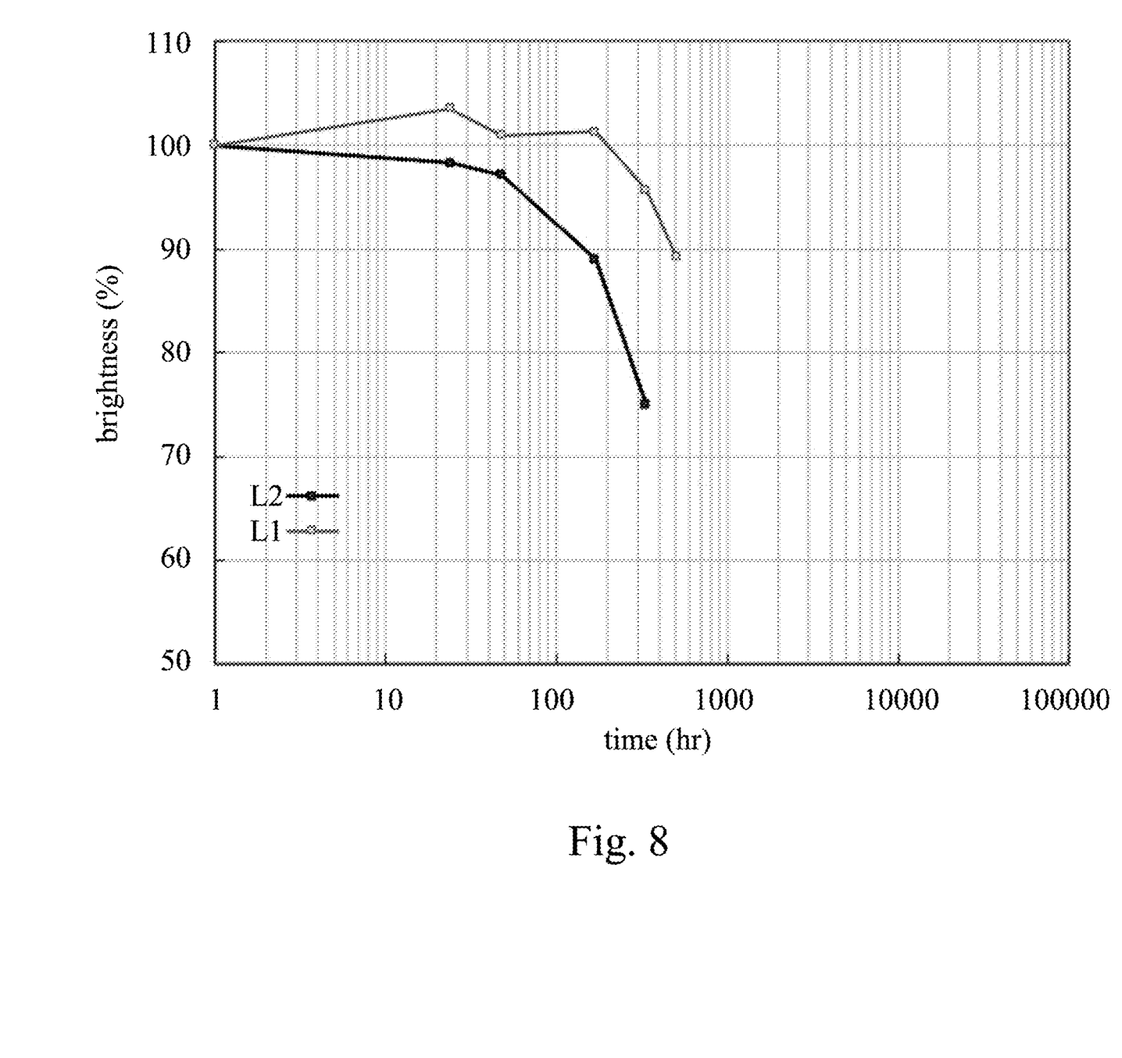
FIG. 8 is a brightness-to-time diagram of the wavelength converting material of the embodiment 1 of the present disclosure and a wavelength converting material of a comparative example 1.

FIG. 8 is a brightness-to-time diagram of the wavelength converting material of the embodiment 1 of the present disclosure and a wavelength converting material of the comparative example 1. In general, a lifetime of a light emitting element is evaluated by $L_{50}$, in which $L_{50}$ is the time required for the brightness of the light emitting element to decay to 50% of its original brightness. Reference is made to FIG. 8. A curve L1 is a trend line of the brightness of the wavelength converting material of the embodiment 1 as a function of time, and a curve L2 is a trend line of the brightness of the wavelength converting material of the comparative example 1 as a function of time. As shown in FIG. 8, the brightness of the wavelength converting material of the embodiment 1 decays slowly over time, and after experiencing about 504 hours of luminescence, the brightness of the wavelength converting material of the embodiment 1 can still be maintained by about 90% of its original brightness. In contrast, the brightness of the wavelength converting material of the comparative example 1 decays fast over time, and after experiencing about 336 hours of luminescence, the brightness of the wavelength converting material of the comparative example 1 is only maintained by about 75% of its original brightness.

Figure 9:
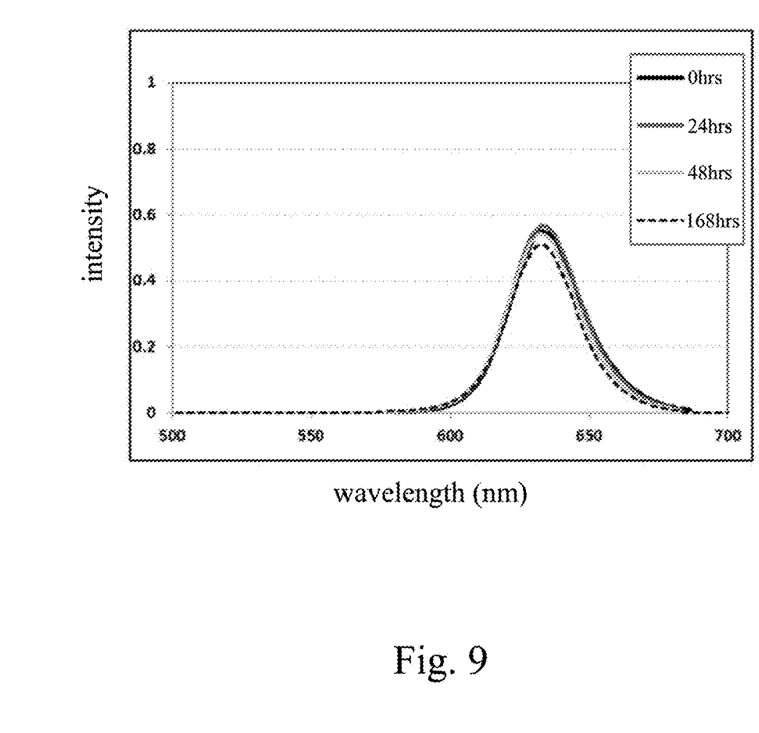
FIG. 9 is an intensity-to-time diagram of the wavelength converting material of the embodiment 1 of the present disclosure.
Figure 10:
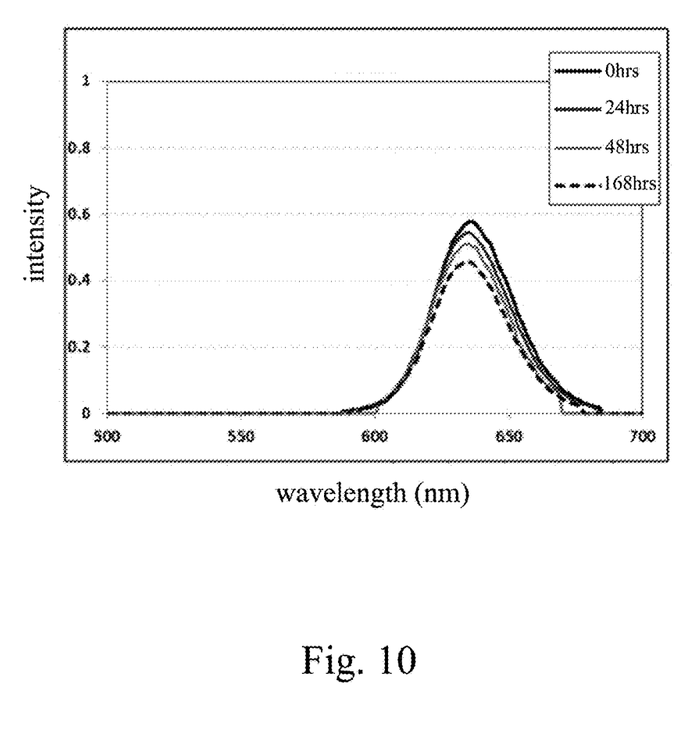
FIG. 10 is an intensity-to-time diagram of the wavelength converting material of the comparative example 1.

FIG. 9 is an intensity-to-time diagram of the wavelength converting material of the embodiment 1 of the present disclosure. FIG. 10 is an intensity-to-time diagram of the wavelength converting material of the comparative example 1. Reference is made to FIG. 9 and FIG. 10. The wavelength converting material of the embodiment 1 of the present disclosure has a extremely small degree of decline in luminescence intensity in each wavelength range after experiencing luminescence of about 168 hours. In contrast, the wavelength converting material of the comparative example 1 has a large degree of decline in luminescence intensity in each wavelength range after experiencing luminescence of about 168 hours. In detail, in a range of wavelength from about 620 nm to about 650 nm, the wavelength converting material of the comparative example 1 has a large decline in the luminescence intensity, and the wavelength converting material of the embodiment 1 of the present disclosure has a relatively small decline in the luminescence intensity. This result shows that in addition to increasing the luminescence lifetime of the wavelength converting material, the first protective layer 120 can maintain the uniformity of the color emitted by the wavelength converting material under a long period of luminescence.

The present disclosure provides a wavelength converting material having a good luminescence lifetime, in which the luminescence intensity can be maintained after a long period of luminescence. Since the protective layer protects the luminous core from damage by external substances such as oxygen and moisture, the wavelength converting material can have a good luminescence lifetime. In particular, the aluminum silicate of the protective layer has the composition of specific configurations, such that the protective layer can perform a better protective function than a general protective layer. It is note that the protective layer is not only suitable for the quantum dot material but also for the phosphor powder material. Furthermore, the light emitting device including the aforementioned wavelength converting material can have good reliability.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A wavelength converting material, comprising:
   a luminous core; and
   a first protective layer covering the luminous core, wherein the first protective layer comprises aluminum silicate, the aluminum silicate comprises a plurality of silicon atoms, each of the silicon atoms is one of a zeroth configuration $Q^4(0Al)$, a first configuration $Q^4(1Al)$, a second configuration $Q^4(2Al)$, a third configuration $Q^4(3Al)$ and a fourth configuration $Q^4(4Al)$, the silicon atoms of the zeroth configuration $Q^4(0Al)$ do not connect with aluminum oxide group, the silicon atoms of the first configuration $Q^4(1Al)$ connect with one aluminum oxide group, the silicon atoms of the second configuration $Q^4(2Al)$ connect with two aluminum oxide groups, the silicon atoms of the third configuration $Q^4(3Al)$ connect with three aluminum oxide groups, the silicon atoms of the fourth configuration $Q^4(4Al)$ connect with four aluminum oxide groups, and a total number of the silicon atoms of the third configuration $Q^4(3Al)$ and the fourth configuration $Q^4(4Al)$ is larger than a total number of the silicon atoms of the zeroth configuration $Q^4(0Al)$, the first configuration $Q^4(1Al)$, and the second configuration $Q^4(2Al)$.

2. The wavelength converting material of claim 1, wherein as a total number of the silicon atoms of the aluminum silicate is 100%, a total number of the silicon atoms of the third configuration $Q^4(3Al)$ and the fourth configuration $Q^4(4Al)$ is larger than 80%.

3. The wavelength converting material of claim 1, wherein in a $^{29}$Si nuclear magnetic resonance ($^{29}$Si NMR) spectroscopy of the wavelength converting material, a chemical shift of a waveform peak of each of the silicon atoms of the aluminum silicate is in a range from about −70 ppm to about −120 ppm, and in a $^{27}$Al nuclear magnetic resonance ($^{27}$Al NMR) spectroscopy of the wavelength converting material, a chemical shift of a waveform peak of each of the aluminum atoms of the aluminum silicate is in a range from about 40 ppm to about 80 ppm.

4. The wavelength converting material of claim 1, wherein in a $^{29}$Si nuclear magnetic resonance ($^{29}$Si NMR) spectroscopy of the wavelength converting material, a chemical shift of a waveform peak of the third configuration $Q^4(3Al)$ is in a range from about −84 ppm to about −95 ppm, and a chemical shift of a waveform peak of the fourth configuration $Q^4(4Al)$ is in a range from about −80 ppm to about −93 ppm.

5. The wavelength converting material of claim 1, wherein the aluminum silicate comprises a plurality of aluminum atoms, each of the aluminum atoms is one of a third configuration $q^3(3Si)$ and a fourth configuration $q^4(4Si)$, the aluminum atoms of the third configuration $q^3(3Si)$ connect with three silicon oxide groups, the silicon atoms of the fourth configuration $q^4(4Si)$ connect with four silicon oxide groups, and in a $^{27}$Al nuclear magnetic resonance ($^{27}$Al NMR) spectroscopy of the wavelength converting material, chemical shifts of waveform peaks of the third configuration $q^3(3Si)$ and the fourth configuration $q^4(4Si)$ are in a range from about 50 ppm to about 80 ppm.

6. The wavelength converting material of claim 1, wherein the luminous core comprises a quantum dot material.

7. The wavelength converting material of claim 6, wherein a surface of the quantum dot material is subjected to a modification treatment comprising a ligand exchange treatment, a microemulsion treatment, an organic material coating, an inorganic material coating, an embedding into pores of mesoporous particles or combinations thereof.

8. The wavelength converting material of claim 7, wherein a material used in the organic material coating comprises poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy, silicone or combinations thereof.

9. The wavelength converting material of claim 7, wherein a material used in the inorganic material coating comprises nitride, metal oxide, silicon oxide or combinations thereof.

10. The wavelength converting material of claim 1, wherein the luminous core comprises a phosphor powder material.

11. The wavelength converting material of claim 10, wherein a surface of the phosphor powder material is subjected to a modification treatment comprising an organic material coating, an inorganic material coating or combinations thereof.

12. The wavelength converting material of claim 11, wherein a material used in the organic material coating comprises poly(methyl methacrylate) (PMMA), polyethylene terephthalate (PET), polyethylene naphthalate (PEN), polystyrene (PS), polyvinylidene difluoride (PVDF), polyvinyl acetate (PVAC), polypropylene (PP), polyamide (PA), polycarbonate (PC), polyimide (PI), epoxy, silicone or combinations thereof.

13. The wavelength converting material of claim 11, wherein a material used in the inorganic material coating comprises nitride, metal oxide, silicon oxide or combinations thereof.

14. A light emitting device, comprising:
a solid-state semiconductor light-emitting element configured to emit first light; and
the wavelength converting material of claim 1 absorbing portions of the first light, and emitting second light of a wavelength different from a wavelength of the first light.

15. The light emitting device of claim 14, wherein the solid-state semiconductor light-emitting element is a light-emitting diode.

* * * * *